(12) United States Patent  
Sa

(10) Patent No.: US 7,017,896 B2  
(45) Date of Patent: Mar. 28, 2006

(54) JIG FOR ADJUSTING CURVATURE OF SUBSTRATE

(75) Inventor: Young Hwan Sa, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 251 days.

(21) Appl. No.: 10/328,000

(22) Filed: Dec. 26, 2002

(65) Prior Publication Data  
US 2003/0132177 A1 Jul. 17, 2003

(30) Foreign Application Priority Data  
Dec. 29, 2001 (KR) .............................. 2001-88520

(51) Int. Cl.  
*B23Q 1/25* (2006.01)

(52) U.S. Cl. ........................................ 269/55; 269/903

(58) Field of Classification Search ............ 269/55, 269/903, 43, 71, 73, 56, 58  
See application file for complete search history.

(56) References Cited

U.S. PATENT DOCUMENTS

| | | | | | |
|---|---|---|---|---|---|
| 2,838,967 | A | * | 6/1958 | Meyer | 269/59 |
| 3,040,604 | A | * | 6/1962 | Benton | 269/69 |
| 3,880,416 | A | * | 4/1975 | Horowitz | 269/152 |
| 4,030,622 | A | * | 6/1977 | Brooks et al. | 414/290 |

* cited by examiner

*Primary Examiner*—Lee D. Wilson  
(74) *Attorney, Agent, or Firm*—McKenna Long & Aldridge, LLP

(57) ABSTRACT

Jig for adjusting curvature of a substrate permits to measure an amount of sag of the substrate coming from variation of a length of the slot or the support bar by varying the length of the slot or the support bar, thereby permitting easy fabrication of the cassette according to a trend of fabricating thinner substrate.

15 Claims, 5 Drawing Sheets

JIG FOR ADJUSTING CURVATURE OF SUBSTRATE

This application claims the benefit of the Korean Application No. P2001-88520 filed on Dec. 29, 2001, which is hereby incorporated by reference.

BACKGROUND OF THE INVENTION

1. Field of the Invention

The present invention relates to a jig for adjusting curvature of a substrate, and more particularly, to a jig for adjusting curvature of a substrate, in which curvature of the substrate in a cassette used in fabrication of a liquid crystal display (LCD) device is measured, for easy fabrication of the cassette.

2. Background of the Related Art

Applications of the LCDs have been diversified from watches, calculators, PC monitors, and notebook computers to TVs, monitors for aviation, PDAs (Personal Digital Assistants), and mobile stations owing to features of low voltage operation, low power consumption, realization of full colors, light weight, thin, and compact.

The LCD is provided with a liquid crystal display panel for displaying a picture, and a circuit part for driving the liquid crystal display panel.

The LCD panel has a first substrate having thin film transistor (TFT) array formed thereon, a second substrate having color filter array formed thereon, and a liquid crystal layer formed between the two substrates.

The first glass substrate having the TFT array formed thereon is provided with a plurality of gate lines arranged in one direction at fixed intervals, a plurality of data lines arranged in a direction perpendicular to the gate lines at fixed intervals to define pixel regions, a plurality of pixel electrodes in respective pixel regions for displaying a picture, and a plurality of thin film transistors in respective pixel regions at cross points of the gate lines and the data lines for being turned on/off in response to driving signals on the gate lines for transmitting a picture signal from the data lines to the pixel electrodes.

The second glass substrate having the color filter array formed thereon is provided with a black matrix layer for shielding a light from parts excluding the pixel regions, a R, G, B color filter layer formed opposite to the pixel regions for realizing colors, and a common electrode formed on an entire surface inclusive of the color filter layer. Of course, the common electrode is formed on the first substrate in an LCD of an IPS mode.

The first and second substrates are bonded together, with a space between the two substrates, and a liquid crystal layer is formed between the first and second substrates.

The substrate is a glass plate of which weight portion in the LCD panel is great. Therefore, in order to reduce weight of the LCD panel, it is required to reduce weight of the glass substrates, at the end, to require thin glass substrates.

A process for fabricating the LCD may be divided into three processes of a substrate fabrication process, a cell fabrication process, and a module fabrication process.

The substrate fabrication process may be divided into processes of fabrication of the TFT, and the color filter on the cleaned glass substrates. The TFT fabrication process is a process for fabricating a plurality of thin film transistors and pixel electrodes on a first substrate, and the color filter fabrication process is a process for forming R, G, B color filter layer by using dye or pigment on a second substrate having a light shielding layer formed thereon, and the common electrode (ITO).

The cell fabrication process is a process for fabricating cells of the LCD by scattering spacers between two substrates of the first substrate having the TFT fabrication process finished, and the second substrate having the color filter fabrication process finished, bonding the two substrates, and injecting liquid crystal between the two substrates, and, finally, the module fabrication process is a process for fabricating a circuit part for processing signals, and connecting the LCD panel and the signal processing circuit part, to fabricate a module.

In the LCD fabrication process, it is required that the substrates are conveyed or carried to an apparatus required for a process, progressively, or in a form of group, for passing through the substrate fabrication process, the cell fabrication process, and the module fabrication process. Moreover, since entire fabrication line can not be stopped for repair of a part of the fabrication apparatus in view of the fabrication process, it is required that the fabrication apparatus is provided with a means for temporary storage of the substrates.

To meet this requirement, a cassette is used. By moving the cassette with a plurality of the substrates stored therein, the plurality of substrates are movable at a time. Though dependent on the cassettes, when the plurality of substrates are stored in the cassette, the substrates are bend.

Such a cassette will be explained, with reference to the attached drawings. FIG. 1 illustrates a front view of the cassette.

Referring to FIG. 1, the cassette has hexahedral body 13 for storing the plurality of substrates in horizontal position. There are vertical frames 13a vertical to ground at at least opposite two surfaces of the body 13, a plurality of slots 15 for supporting edges of the substrate 11, and stoppers 17 at opposite side of a substrate entrance for stopping the substrate 11 inserted into the cassette.

The vertical frame 13a having the slots 15 formed thereon may be formed, not only at the four sides of the hexahedral body, but also at corners of the cassette, more. The slots 15, around 20 in number on each of the vertical frame 13a, have a fixed length and width, for supporting edges, or sides, of the substrates 11.

As explained, the substrate is a thin glass plate for reducing weight of the LCD, which is liable to bend. Therefore, the length of the slot 15 is a major factor of fixing curvature of the substrate 11, the shorter the slot 15, the greater the curvature of the substrate 11, and the longer the slot 15, the smaller the curvature of the substrate 11.

That is, FIG. 2 illustrates sag of the substrate schematically, wherein the substrate 11 is supported on the slots 15, which are fixed to the vertical frames 13a.

A depth Y of the sag of the substrate 11 can be measured with a height gage, and since a robot is to bring the substrate 11 into the cassette and place on the slot 15, for not giving interference to the movement of the robot, it is required that the depth Y of sag is kept to be within a certain value for preventing the substrates from overlapping with the other due to the sag.

After all, the longer the length of the slot 15, the smaller the depth of the sag Y as the substrate 11 is supported on the slots 15 the more, and the shorter the length of the slot 15, the greater the depth of the sag Y as the substrate 11 is supported on the slots 15 the less.

Therefore, it is required that the cassette is fabricated, not only to fit a size of the substrate 11, but also to have a proper length of the slot 15 depending on the curvature of the substrate.

However, the related art cassette has the following problem.

Since the slots in the cassette is fixed to the vertical frame, it is required to fabricate a mock up of the cassette according to the curvature of the substrate, and test the mock up cassette for a plurality of time before the cassette is fabricated.

That is, for finding a slot suitable to the substrate, a plurality of fabrication of the mock up cassette is required for coping with slot length variation with a thickness of the substrate, which increases cost and requires longer production time, that drops the productivity.

SUMMARY OF THE INVENTION

Accordingly, the present invention is directed to a jig for adjusting curvature of a substrate that substantially obviates one or more of the problems due to limitations and disadvantages of the related art.

An object of the present invention is to provide a jig for adjusting curvature of a substrate, which can measure an adjustment of curvature of the substrate for fabricating a cassette that optimizes curvature of the substrate by varying a slot length with a thickness of the substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the jig for adjusting curvature of a substrate includes a cassette storing the substrate, a main shaft fixed to the cassette in a direction parallel to the substrate, a movable bar movable parallel to the main shaft, a reference bar rotatably fitted to the main shaft moving the movable bar back and forth, and a plurality of slots each fixed to the movable bar supported on the main shaft having a length adjustable according to the back and forth movements of the movable bar.

In another aspect of the present invention, there is provided a jig for adjusting curvature of a substrate including a cassette having a plurality of vertical frames on both sides of a substrate entrance, at least two main shafts fixed to the vertical frames at both sides of the cassette, at least two movable bar movable parallel to the main shafts, at least two reference bars rotatably fitted to the main shafts respectively for moving the movable bars back and forth, and a plurality of slots each fixed to the movable bar supported on the main shaft having a length adjustable according to the back and forth movements of the movable bar.

In further aspect of the present invention, there is provided a jig for adjusting curvature of a substrate including a cassette having a plurality of vertical frames on both sides of a substrate entrance storing substrates, and a stopper at an opposite side of the substrate entrance stopping the substrate, each of the frame having a plurality of slots, a main shaft fixed to the stopper in a direction parallel to the substrate, a movable bar movable parallel to the main shaft, a reference bar rotatably fitted to the main shaft vertical thereof moving the movable bars back and forth, and a support bar fixed to the movable bar, and supported on the main shaft, having a length adjustable according to the reference bar.

Thus, the jig for adjusting curvature of a substrate of the present invention can fabricate a cassette for thin substrates easily because variation of curvature of the substrate varied with a length of the slots can be measured easily by varying the length of the slots or support bar.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENT

Figure 1:
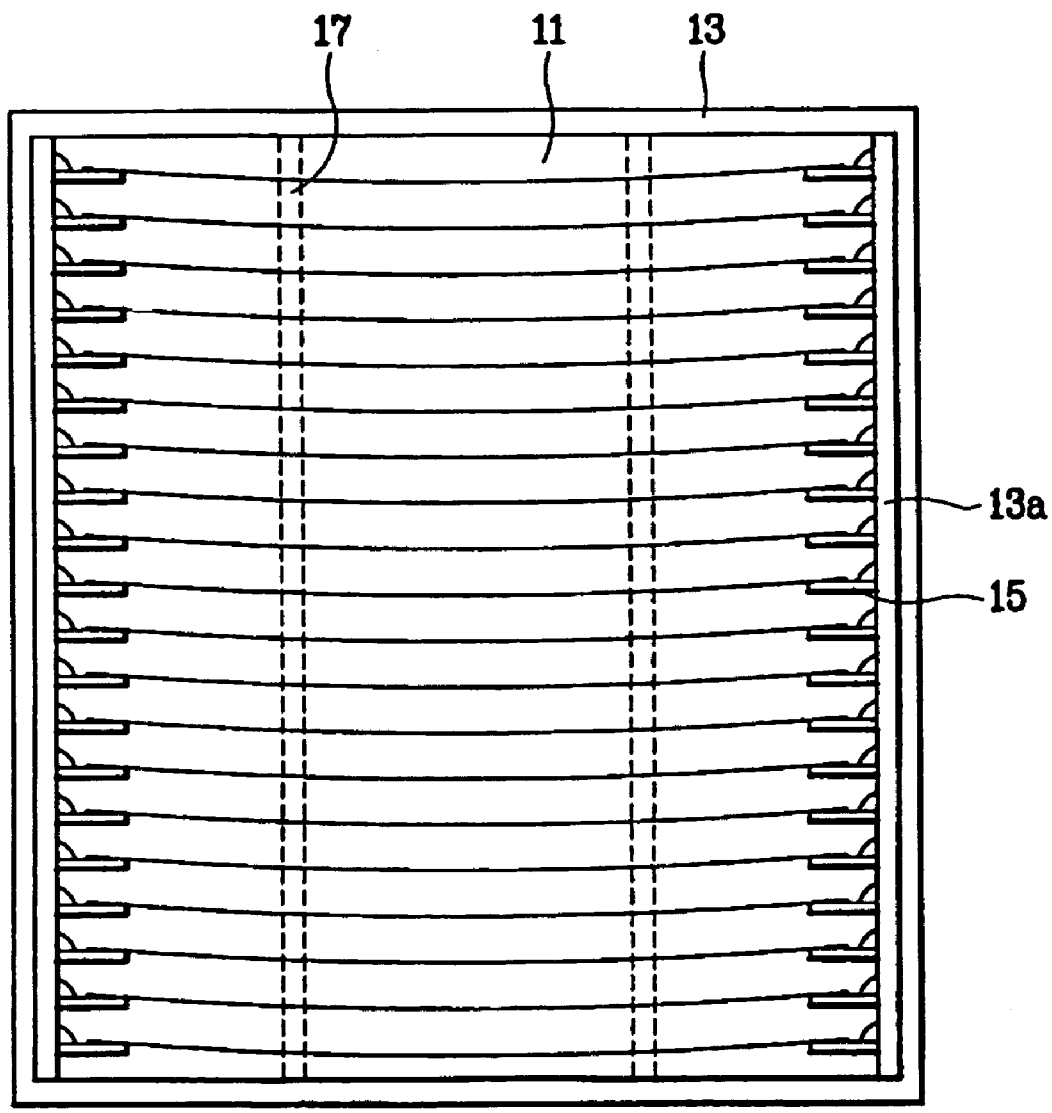
FIG. 1 illustrates a front view of a cassette.
Figure 2:
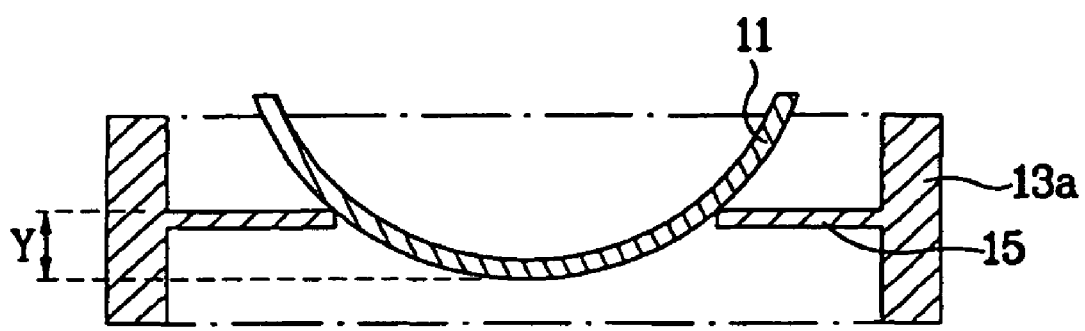
FIG. 2 illustrates sag of the substrate schematically.
Figure 3A:
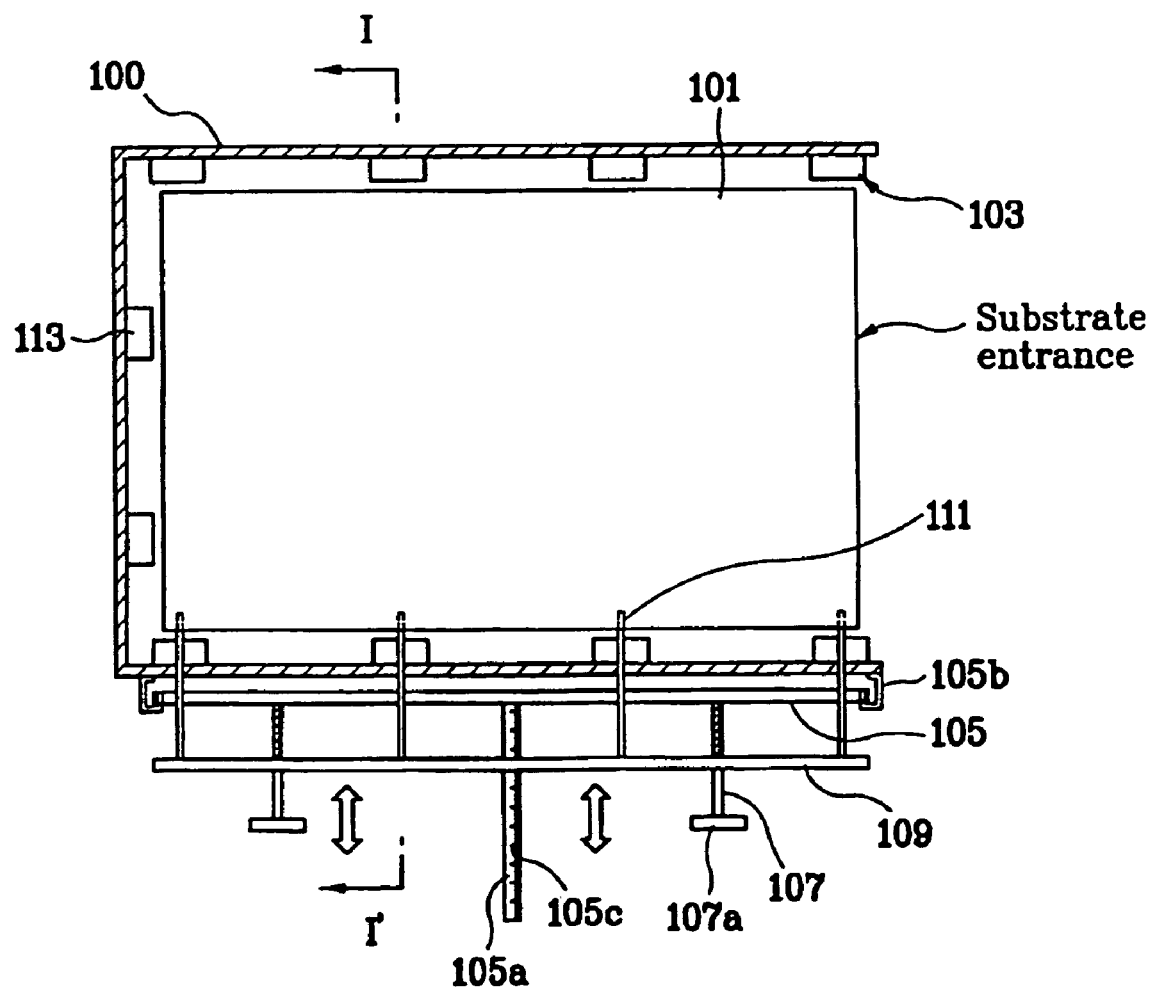
FIG. 3A illustrates a top view of a jig for adjusting curvature of a substrate in accordance with a first embodiment of the present invention.

Reference will now be made in detail to the embodiments of the present invention, examples of which are illustrated in the accompanying drawings. FIG. 3A illustrates a plan view of a jig for adjusting curvature of a substrate in accordance with a first embodiment of the present invention.

Figure 3B:
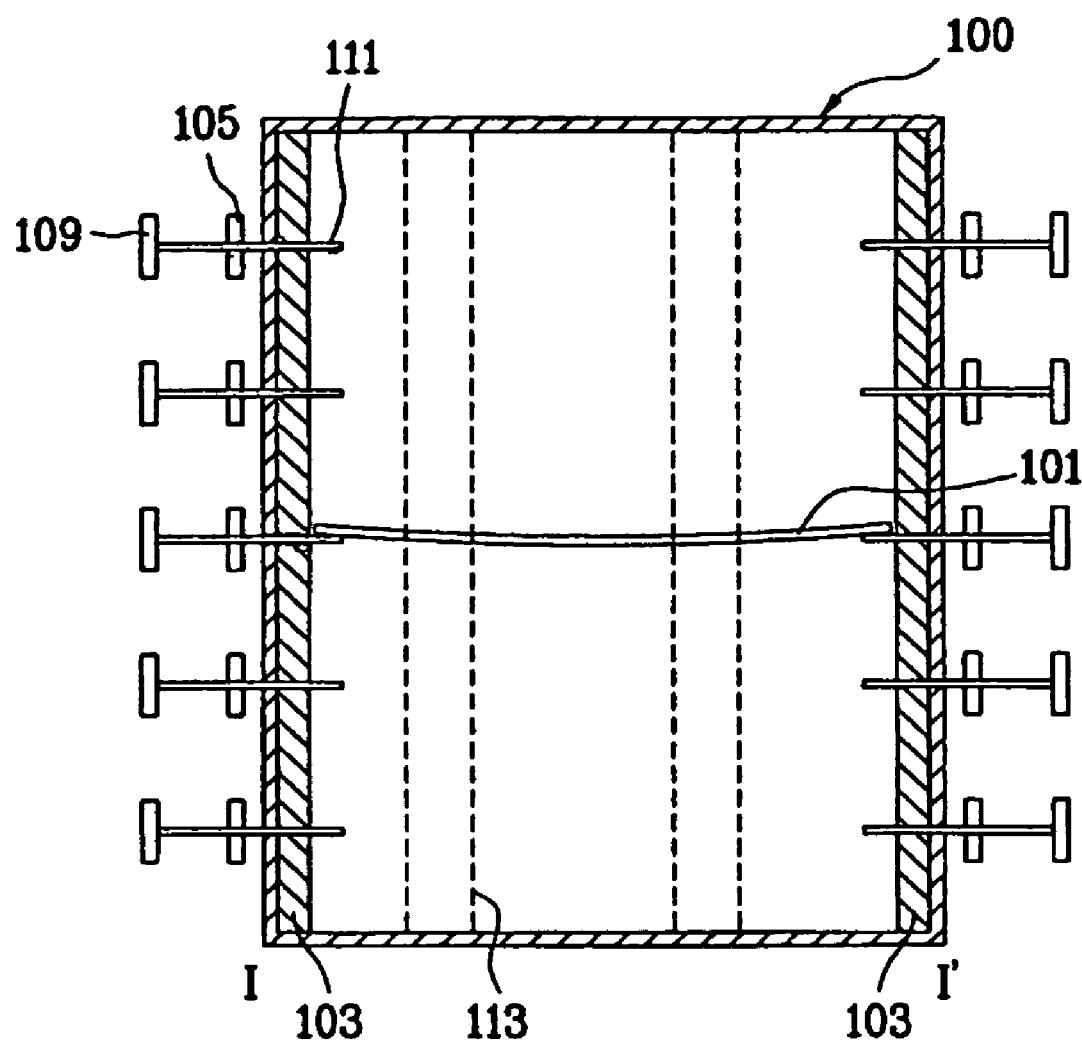
FIG. 3B illustrates a front view of a cassette in accordance with an embodiment of present invention.

Referring to FIG. 3A, the cassette 100 (See FIG. 3B) has a plurality of vertical frames 103 at both sides of a substrate 101 entrance vertical to ground. The jig for adjusting curvature of a substrate in accordance with a first embodiment of the present invention includes a main shaft 105 fixed to the vertical frames 103 in a direction parallel to the substrate 101, reference bars 107 vertical to the main shaft 105 and parallel to a plane of the substrate 101, a movable bar 109 movable along the reference bars 107 parallel to the substrate 105, and a plurality of support bars 111 fixed to the movable bar 109 supported on the main shaft 105 having a length adjustable according to curvature of the substrate 101. There are at least two reference bars 107 fitted to the cassette.

Though not shown, there is another jig for adjusting curvature of a substrate fitted at a side of the cassette opposite to a side the jig for adjusting curvature of a substrate is fitted thereto.

The jig for adjusting curvature of a substrate in accordance with a first embodiment of the present invention permits to measure the depth of sag of the substrate as a plurality of the jigs are positioned on opposite sides the substrate 101, making lengths of the support bars 111 supporting the substrate 101 identical. The depth of sag of the substrate 101 is measured by using a height gage.

Each of the plurality of reference bars 107 has a thread of a fixed pitch in a longitudinal direction thereof, for moving the movable bar 109 back and forth by rotating the reference bar 107 at knobs 107a.

Moreover, there is a guide 105a fitted with an adjusting ruler (not shown) at a center of the main shaft 105 for measuring movement of the movable bar accurately.

Therefore, by determining an amount of sag of the substrate 101 appropriate to the substrate 101 by adjusting the length of the support bar 111 according to change of a thickness of the substrate 101, fabrication of the cassette for conserving and storing the substrate 101 is made easy.

The operation of the jig for adjusting curvature of a substrate in accordance with a first embodiment of the present invention will be explained.

At first, a plurality of ends of the main shaft 105 are fixed to the vertical frames 103 at opposite corners of the cassette by clamp 105b, and lengths of the support bars 111 are put the same.

After inserting the substrate 101 into the cassette through a substrate entrance 112 (FIG. 3B), an amount of the sag of the substrate 101 is measured by using a height gage (not shown), and the length of the support bar 111 is measured repeatedly while turning the knobs 107a. At the end, after verifying an optimum depth of the sag, the cassette can be fabricated by applying a final length of the support bar 111.

Thus, the jig for adjusting curvature of a substrate in accordance with a first embodiment of the present invention can verify curvature of the substrate effectively by varying the length of the support bar 111 with change of a thickness of the substrate 101, and permits an easy finding of the length of the support bar 111 for an optimum sag.

In the meantime, by fitting one more supporter bar at a rear side of the cassette additionally as the substrate 101 becomes thinner, the substrate 101 can be placed with better safety by reducing the sag of the substrate within the cassette.

Figure 4:
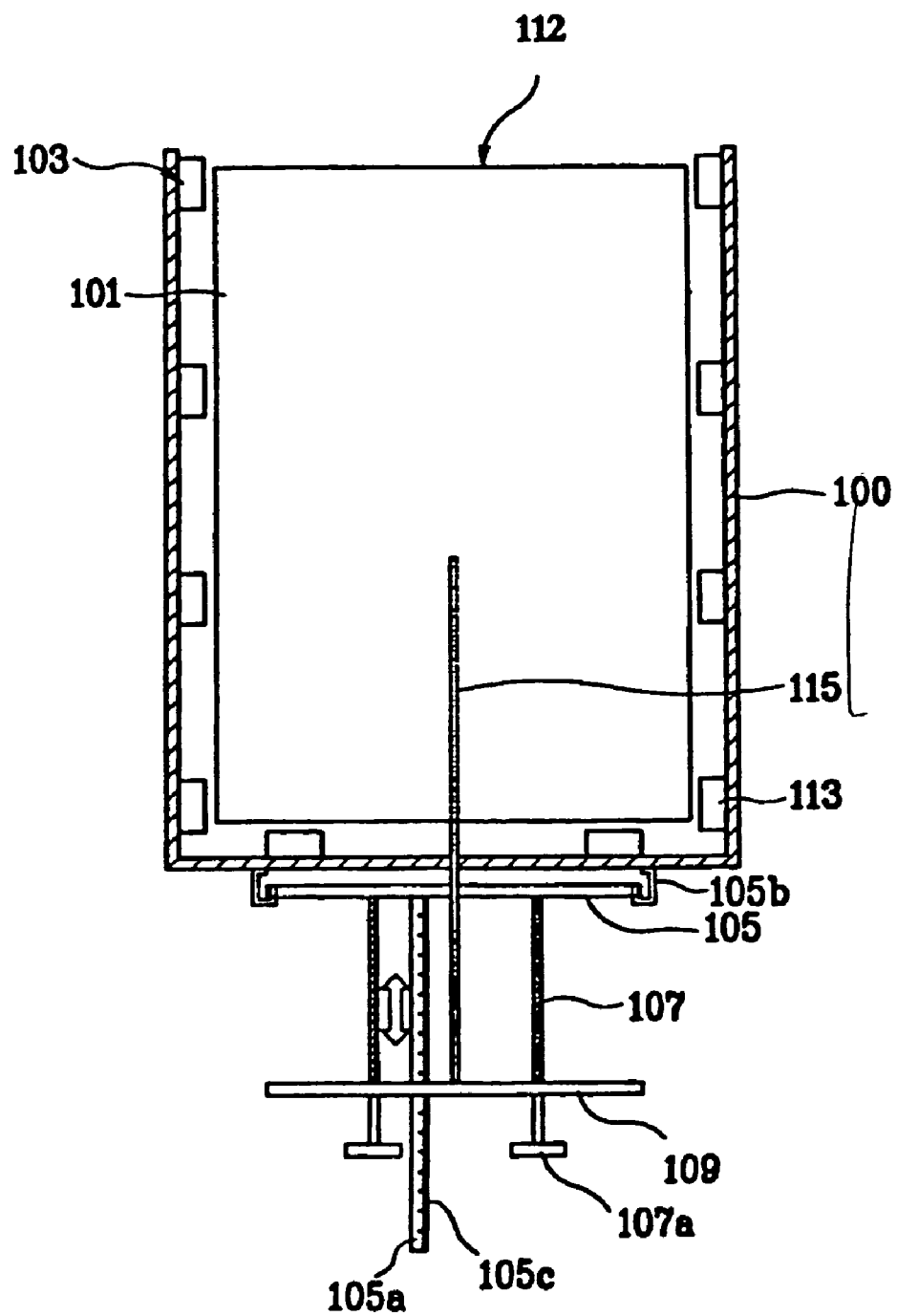
FIG. 4 illustrates a top view of a jig for adjusting curvature of a substrate in accordance with a second embodiment of the present invention.

FIG. 4 illustrates a plan view of a jig for adjusting curvature of a substrate in accordance with a second embodiment of the present invention.

A cassette (not shown) having the jig for adjusting curvature of a substrate in accordance with a second embodiment of the present invention applied thereto includes a plurality of vertical frames 103 vertical to ground on both sides of a substrate 101 entrance, a plurality of slots (not shown) of a length fitted to the vertical frames 103, and a plurality of stoppers 113 on an opposite side of the entrance for stopping the substrate 101 inserted into the cassette.

Referring to FIG. 4, the jig for adjusting curvature of a substrate in accordance with a second embodiment of the present invention includes a main shaft 105 fixed to the stoppers 113 parallel to the substrate 101, reference bars 107 vertical to the main shaft 105 and parallel to a substrate 101 plane, a movable bar 109 movable along the reference bars 107 parallel to the main shaft, and a support bar 115 fixed to the movable bar 109 and supported on the main shaft 105 for having a length thereof adjusted according to curvature of the substrate 101.

Though not shown, a connection bar may be fitted to each of the plurality of the stoppers 113 additionally, and the support bar 115 may be fixed to centers of the connection bars for supporting the substrates 101.

The support bar supports the substrate 101 passed through periphery of the substrate 101 having no active regions formed therein. That is, the substrate 101 may be supported by the slots on the vertical frames 103 at opposite edges thereof in symmetry, and by the support bar 115 at one side periphery thereof in asymmetry.

Accordingly, the depth of sag of the substrate 101 at the cassette entrance can be measured by the height gage.

Each of the plurality of reference bars 107 has a thread of a fixed pitch in a longitudinal direction, for moving back and forth the movable bar 109 by rotating the reference bar 107 at knobs 107a.

Moreover, there is a guide 105a fitted with an adjusting ruler (not shown) at a center of the main shaft 105 for an accurate measurement of the movement of the movable bar 109.

Therefore, by determining an amount of sag of the substrate 101 appropriate to the substrate 101 by adjusting the length of the support bar 111 according to change of a thickness of the substrate 101, fabrication of the cassette for conserving and storing the substrate 101 is made easy.

Thus, the sag of the substrate 101 can be measured by using the plurality of stoppers 113 in the jig for adjusting curvature of a substrate in accordance with the second embodiment of the present invention.

As has been explained, the jig for adjusting curvature of a substrate of the present invention permits effective verification of the amount of sag of the substrate by varying the length of the support bars (111 in FIG. 3A) or the support bar 115 according to a trend of fabricating thinner substrate 101, and fabricate the cassette by measuring lengths of the slots or the support bars for the optimum amount of sag.

The jig for adjusting curvature of a substrate of the present invention has the following advantage.

The jig for adjusting curvature of a substrate of the present invention can meet requirements coming from the trend of fabricating thinner substrates because measurement of curvature of the substrate caused by variation of the slots or support bars is made easy by varying lengths of the slots or the support bars.

It will be apparent to those skilled in the art that various modifications and variations can be made in the jig for adjusting curvature of a substrate of the present invention without departing from the spirit or scope of the invention. Thus, it is intended that the present invention cover the modifications and variations of this invention provided they come within the scope of the appended claims and their equivalents.

What is claimed is:

1. A jig for adjusting curvature of a substrate comprising:
a cassette storing the substrate;
a main shaft fixed to the cassette in a direction parallel to the substrate;
a movable bar movable parallel to the main shaft;
reference bars rotatably fitted to the main shaft for moving the movable bar back and forth; and
a plurality of support bars each fixed to the movable bar supported on the main shaft having a length adjustable according to the back and forth movements of the movable bar, wherein the plurality of support bars support the substrate.

2. A jig as claimed in claim 1, wherein the main shaft further includes an adjusting ruler measuring movement of the movable bar.

3. A jig as claimed in claim 1, wherein the main shaft further includes clamps fixing the main shaft to the cassette.

4. A jig as claimed in claim 1, wherein the reference bar includes a thread of a fixed pitch moving the movable bar.

5. A jig as claimed in claim 4, wherein the reference bar further includes a knob rotating the reference bar.

6. A jig as claimed in claim 1, wherein the reference bars includes at least two reference bars moving the movable bar in parallel to the main shaft.

7. A jig as claimed in claim 1, wherein the cassette includes a plurality of vertical frames.

8. A jig as claimed in claim 7, wherein the vertical frames have the main shaft fixed thereto.

9. A jig for adjusting curvature of a substrate comprising:
a cassette having a plurality of vertical frames on both sides of a substrate entrance;
at least two main shafts fixed to the vertical frames at both sides of the cassette;
at least two movable bar movable parallel to the main shafts;
at least two reference bars rotatably fitted to the main shafts respectively for moving the movable bars back and forth; and
a plurality of support bars each fixed to the movable bar supported on the main shaft having a length adjustable according to the back and forth movements of the movable bar, wherein the plurality of support bars support the substrate.

10. A jig for adjusting curvature of a substrate comprising:
a cassette having a plurality of vertical frames on both sides of a substrate entrance storing substrates, and a stopper at an opposite side of the substrate entrance stopping the substrate, each of the frame having a plurality of support bars;
a main shaft fixed to the stopper in a direction parallel to the substrate;
a movable bar movable parallel to the main shaft;
a reference bar rotatably fitted to the main shaft vertical thereof moving the movable bars back and forth, the plurality of support bars a fixed to the movable bar, and supported on the main shaft, having a length adjustable according to the reference bar, wherein the main shaft and the movable bar move relative to each other and wherein the reference bar adjusts the movable bar which adjusts the plurality of support bars.

11. A jig as claimed in claim 10, wherein the main shaft includes an adjusting ruler measuring movement of the movable bar.

12. A jig as claimed in claim 10, wherein the main shaft further includes clamps fixing the main shaft to the cassette.

13. A jig as claimed in claim 10, wherein the reference bar includes a thread of a fixed pitch moving the movable bar.

14. A jig as claimed in claim 13, wherein the reference bar further includes a knob rotating the reference bar.

15. A jig as claimed in claim 10, wherein there are at least two reference bars moving the movable bar in parallel to the main shaft.

* * * * *